(12) United States Patent
Hirao et al.

(10) Patent No.: US 7,928,505 B2
(45) Date of Patent: Apr. 19, 2011

(54) SEMICONDUCTOR DEVICE WITH VERTICAL TRENCH AND LIGHTLY DOPED REGION

(75) Inventors: Takashi Hirao, Hitachi (JP); Takayuki Hashimoto, Tokai (JP); Noboru Akiyama, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/326,392

(22) Filed: Dec. 2, 2008

(65) Prior Publication Data

US 2009/0140327 A1 Jun. 4, 2009

(30) Foreign Application Priority Data

Dec. 3, 2007 (JP) ................. 2007-312001

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............. 257/330; 257/332; 257/E27.091

(58) Field of Classification Search ........... 257/135, 257/302, 330, 331, 332, 333, E27.091
See application file for complete search history.

(56) References Cited

U.S. PATENT DOCUMENTS 6,710,403 B2 3/2004 Sapp
2008/0073707 A1* 3/2008 Darwish ................ 257/330

FOREIGN PATENT DOCUMENTS

| JP | 2003-533889 | 11/2003 |
| JP | 2004-241413 | 8/2004 |
| JP | 2006-196518 | 7/2006 |
| WO | 02/058160 | 7/2002 |

* cited by examiner

*Primary Examiner* — Hoai V Pham
(74) *Attorney, Agent, or Firm* — Mattingly & Malur, P.C.

(57) ABSTRACT

The vertical trench MOSFET comprises: an N type epitaxial region formed on an upper surface of an $N^+$ type substrate having a drain electrode on a lower surface thereof; a gate trench extending from a front surface into the N type epitaxial region; a gate electrode positioned in the gate trench so as to interpose an insulator; a channel region formed on the N type epitaxial region; a source region formed on the channel region; a source electrode formed on the source region; a source trench extending from the front surface into the N type epitaxial region; and a trench-buried source electrode positioned in the source trench so as to interpose an insulator, wherein the source electrode contacts with the trench-buried source electrode.

16 Claims, 15 Drawing Sheets

P TYPE ION IMPLANTATION

N TYPE ION IMPLANTATION

Si-ETCHING

SEMICONDUCTOR DEVICE WITH VERTICAL TRENCH AND LIGHTLY DOPED REGION

CROSS-REFERENCE TO RELATED APPLICATION

The present application claims priority from Japanese Patent Application No. JP 2007-312001 filed on Dec. 3, 2007, the content of which is hereby incorporated by reference into this application.

TECHNICAL FIELD OF THE INVENTION

The present invention relates to a semiconductor device of a power MOSFET (Metal Oxide Semiconductor-Field Effect Transistor). More particularly, it relates to a technology effectively applied to a device structure to realize the low on-resistance in a power MOSFET with low breakdown voltage and a manufacturing method thereof.

BACKGROUND OF THE INVENTION

According to a consideration of the present inventors, in a power supply of information equipment and the like, a further reduction in loss is required from the viewpoint of power consumption and thermal design. In particular, in a power MOSFET with low breakdown voltage (for example, breakdown voltage of 30 V) used therein, the reduction in on-resistance is required.

As a low on-resistance structure of a power MOSFET, a super junction structure is known. The super junction structure is a structure in which drain-source breakdown voltage is increased by forming a columnar semiconductor region (a column region) having an opposite polarity to an epitaxial region in the epitaxial region, and trade-off between on-resistance and drain-source breakdown voltage can be improved. For example, in Japanese Patent Application Laid-Open Publication No. 2006-196518 (Patent document 1), the column region described above is formed by multiple-stage ion implantation.

SUMMARY OF THE INVENTION

Incidentally, since resistance of a channel region (channel resistance) accounts for a large proportion of on-resistance of the power MOSFET with low breakdown voltage as described above, the reduction in on-resistance by scaling-down (cell shrink) has been promoted. However, with a sufficient reduction of channel resistance by the advance of the scaling down, a resistance of an epi-region (epi-resistance) becomes dominant, and the reduction in epi-resistance is required for the further reduction in on-resistance.

The RESURF (REduced SURface Field) structure that improves the breakdown voltage by forming potential distribution in a horizontal direction is effective for the reduction in epi-resistance. The super junction structure can be also expected to have an effect of improving the breakdown voltage similarly to the RESURF structure. However, since an impurity implanted deeply in order to form the column region described above is diffused in a horizontal direction in the manufacturing method according to Patent document 1 described above, there is a problem that this manner is inappropriate for the power MOSFET with low breakdown voltage having a fine structure.

For the achievement of the reduction in on-resistance in the power MOSFET with low breakdown voltage, the reduction of the channel resistance by scaling-down is required, and at the same time, the increase of the impurity concentration in the epitaxial region is required while maintaining the drain-source breakdown voltage. That is, the RESURF structure appropriate for the fine power MOSFET is required.

Therefore, an object of the present invention is to provide a fine power semiconductor device such as the power MOSFET with low breakdown voltage capable of reducing the on-resistance while maintaining the drain-source breakdown voltage and a manufacturing method thereof.

The above and other objects and novel characteristics of the present invention will be apparent from the description of this specification and the accompanying drawings.

The typical ones of the inventions disclosed in this application will be briefly described as follows.

That is, the typical one is characterized by forming a trench-shaped source electrode (a source trench) in order to increase the impurity concentration of a drift layer while maintaining the drain-source breakdown voltage. More specifically, with the RESURFE effect by the source trench, the drain-source breakdown voltage is maintained even if the impurity concentration in the drift layer is increased, whereby the power MOSFET with the low on-resistance can be provided. Besides, since a body contact is made in the source trench, there is no need to provide a region for the body contact in other region of the front surface of the semiconductor device, and further scaling-down can be achieved.

More specifically, the semiconductor device and the manufacturing method thereof according to the typical embodiment are as follows.

In a typical embodiment of the present invention, a semiconductor device comprises: a first semiconductor region of first conductivity type formed on an upper surface of a semiconductor substrate having a rear surface electrode on a lower surface thereof; a gate trench extending from a front surface of a semiconductor device into the first semiconductor region; a gate electrode positioned in the gate trench so as to interpose an insulator; a second semiconductor region of second conductivity type formed on the first semiconductor region and adjacent to the gate trench; a third semiconductor region of first conductivity type formed on the second semiconductor region and adjacent to the gate trench; a field electrode formed on the third semiconductor region; a field trench extending from the front surface of the semiconductor device into the first semiconductor region; and a trench-buried field electrode positioned in the field trench so as to interpose an insulator, wherein the field electrode contacts with the trench-buried field electrode. Further, the field electrode contacts with the second semiconductor region in the field trench or contacts with a more highly-doped body contact region than the second semiconductor region, the body contact region being of second conductivity type and contacting with the second semiconductor region, and the gate trench and the field trench are formed by silicon-etching.

Also, in another embodiment of the present invention, a distance from the front surface of the semiconductor device to a bottom of the gate trench is equal to that from the front surface of the semiconductor device to a bottom of the field trench, an insulator of a bottom surface in the gate trench is thicker than an insulator of a side surface in the gate trench, and a step of forming the gate trench and a step of forming the field trench are performed at the same time.

Also, in another embodiment of the present invention, a more highly-doped body contact region than the second semiconductor region, the body contact region being of second conductivity type, is selectively formed on a front surface of the second semiconductor region.

Also, in another embodiment of the present invention, a less doped fourth semiconductor region than the first semiconductor region, the fourth semiconductor region being of first conductivity type, is provided in the first semiconductor region under the field trench.

Also, in another embodiment of the present invention, a bottom of the field trench reaches an inside of the semiconductor substrate.

Also, in another embodiment of the present invention, a semiconductor device comprises: a first semiconductor region of first conductivity type formed on an upper surface of a semiconductor substrate having a rear surface electrode on a lower surface thereof; a second semiconductor region of second conductivity type selectively formed on a front surface of the first semiconductor region; a third semiconductor region of first conductivity type selectively formed on a front surface of the second semiconductor region; a gate electrode positioned on the second semiconductor region so as to interpose an insulator; a field electrode formed on the third semiconductor region; a field trench extending from a front surface of a semiconductor device into the first semiconductor region; and a trench-buried field electrode positioned in the field trench so as to interpose an insulator, wherein the field electrode contacts in the field trench with a more highly-doped body contact region than the second semiconductor region, the body contact region being of second conductivity type and contacting with the second semiconductor region.

The effects obtained by typical aspects of the present invention will be briefly described below.

That is, the effects obtained by typical aspects are that it is possible to achieve the reduction in the on-resistance by fabricating a source trench, while maintaining the drain-source breakdown voltage even in a fine power semiconductor device such as the power MOSFET with low breakdown voltage.

BRIEF DESCRIPTIONS OF THE DRAWINGS

Figure 10:
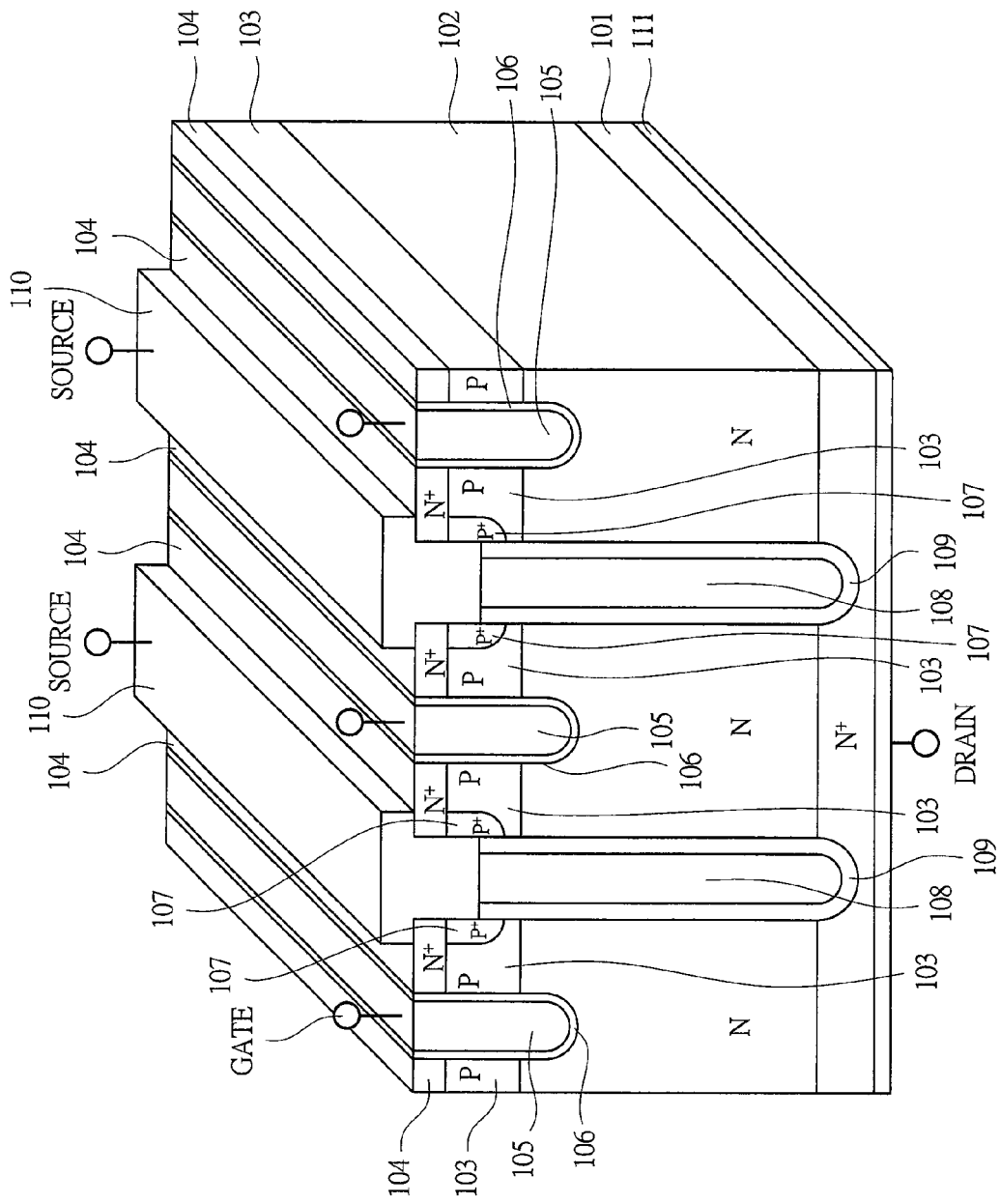
Figure 11:
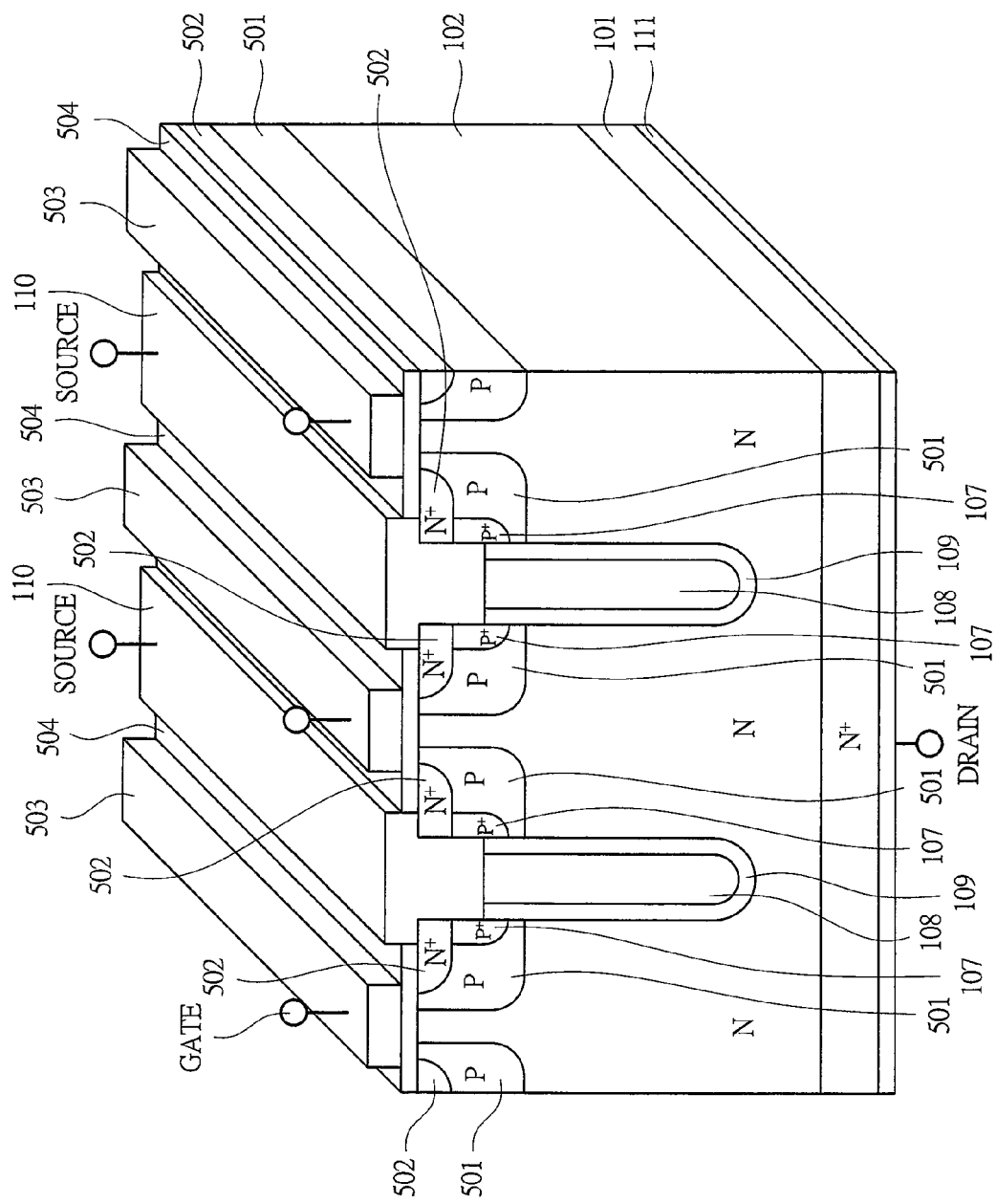

FIG. 10 is a view showing an example of the structure of the vertical trench MOSFET with low breakdown voltage having the RESURF structure according to the fifth embodiment of the present invention; and FIG. 11 is a view showing an example of the structure of the vertical planar MOSFET with low breakdown voltage having the RESURF structure according to the sixth embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

The semiconductor device according to a first embodiment of the present invention is described with reference to FIG. 1 to FIG. 5.

Figure 1:
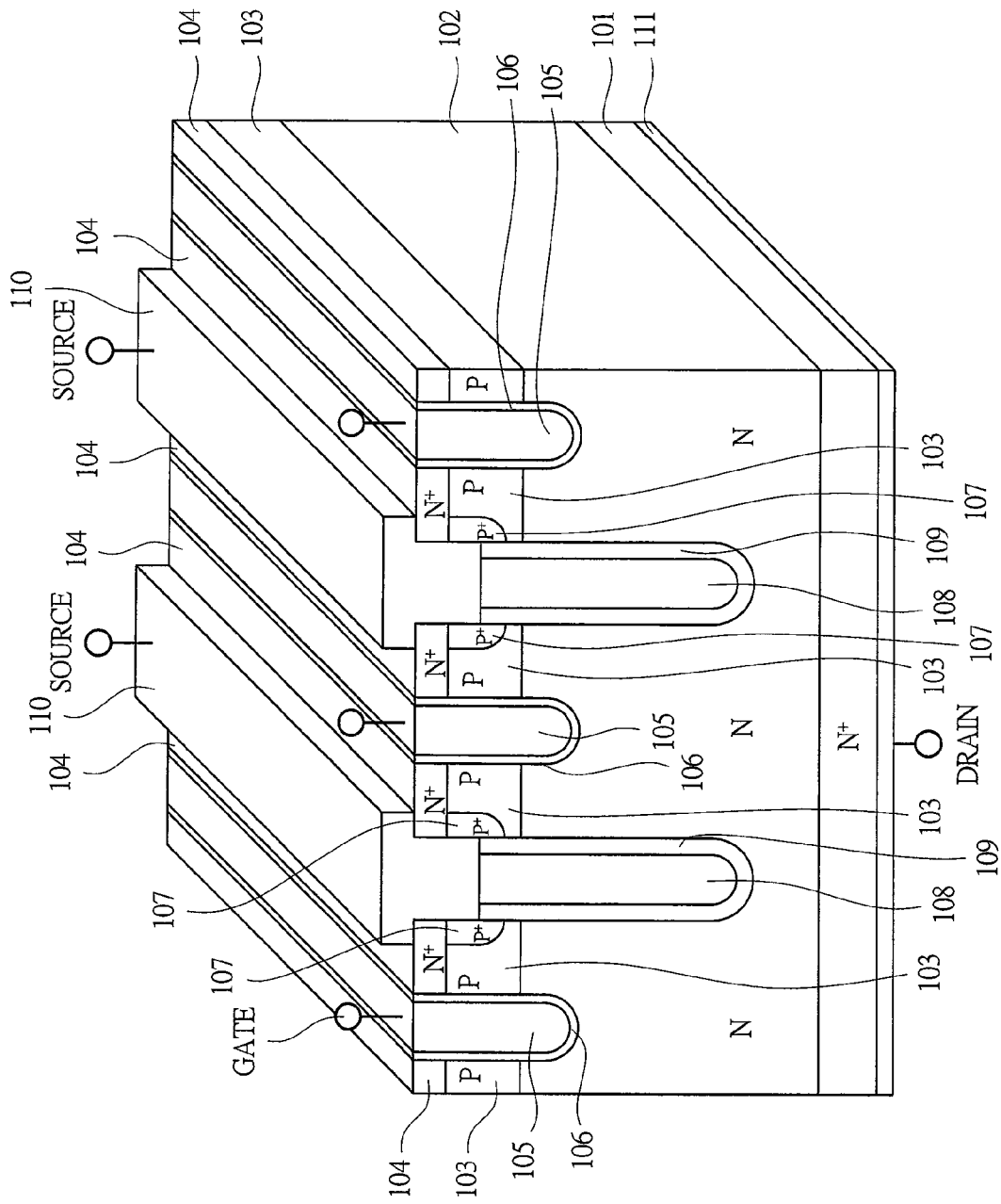
FIG. 1 is a view showing an example of the structure of the vertical trench MOSFET with low breakdown voltage having the RESURF structure according to the first embodiment of the present invention.

FIG. 1 shows an example of a structure of a vertical trench MOSFET with low breakdown voltage having a RESURF structure according to the first embodiment of the present invention.

In the vertical trench MOSFET according to the first embodiment, an N type epitaxial region 102, a channel region 103, a source region 104, a gate electrode 105, a gate insulator 106, a body contact region 107, a trench-buried source electrode 108, a trench-buried source insulator 109, and the like are formed on an $N^+$ type substrate 101, and a source electrode 110 is formed on the front surface thereof and a drain electrode 111 is formed on the rear surface thereof.

More particularly, the N type epitaxial region 102 formed on the upper surface of the $N^+$ type substrate 101 having the drain electrode 111 on the lower surface thereof, a gate trench extending from the front surface into the N type epitaxial region 102, the gate electrode 105 positioned in the gate trench so as to interpose the gate insulator 106, the channel region (P type) 103 formed on the N type epitaxial region 102 and adjacent to the gate trench, the source region ($N^+$ type) 104 formed on the channel region 103 and adjacent to the gate trench, the source electrode 110 formed on the source region 104, a source trench extending from the front surface into the N type epitaxial region 102, and the trench-buried source electrode 108 positioned in the source trench so as to interpose the trench-buried source insulator 109 are provided.

In this configuration, the source electrode 110 contacts with the trench-buried source electrode 108, and the source electrode 110 contacts in the source trench with the body contact region 107 which contacts with the channel region 103. The body contact region 107 is a more highly-doped body contact region ($P^+$ type) than the channel region 103. Further, the distance from the front surface to the bottom of the source trench is longer than that from the front surface to the bottom of the gate trench, and the gate trench and the source trench are arranged so as to be positioned alternately and in parallel to each other. Note that the source electrode 110 is not limited to the structure of contacting with the body contact region 107, but can be applied to the structure of contacting with the channel region 103 in the source trench.

More specifically, in the vertical trench MOSFET according to the first embodiment, the N type epitaxial region 102, the channel region 103, and the source region 104 are sequentially formed on the upper surface of $N^+$ type substrate 101, and the source region 104 is electrically connected to the source electrode 110. The gate trench extends from the front surface into the N type epitaxial region 102, and the gate electrode 105 is buried therein through the gate insulator 106. The source trench positioned alternately and in parallel to the gate trench extends from the front surface into the N type epitaxial region 102, and the trench-buried source electrode 108 is buried therein through the trench-buried source insulator 109. The trench-buried source electrode 108 is electrically connected to the source electrode 110. Further, the source electrode 110 is electrically connected in the source trench to the body contact region 107 adjacent to the channel region 103.

The vertical trench MOSFET according to the first embodiment is characterized by comprising the trench-buried source electrode 108 in the N type epitaxial region 102 through the trench-buried source insulator 109. Potential distribution in a horizontal direction is formed between the trench-buried source electrodes 108, so that the electric field at the PN junction between the N type epitaxial region 102 and the channel region 103 is relaxed, whereby the drain-source breakdown voltage is increased.

Furthermore, the body contact for obtaining the sufficient avalanche resistance is ensured by the contact between the body contact region 107 and the source electrode 110 in the source trench, and therefore there is no need to provide the other region for the body contact on the front surface of the semiconductor device, whereby the scaling-down can be achieved.

FIG. 2 shows an example of the manufacturing method of the vertical trench MOSFET with low breakdown voltage having the RESURF structure according to the first embodiment.

Figure 2A:
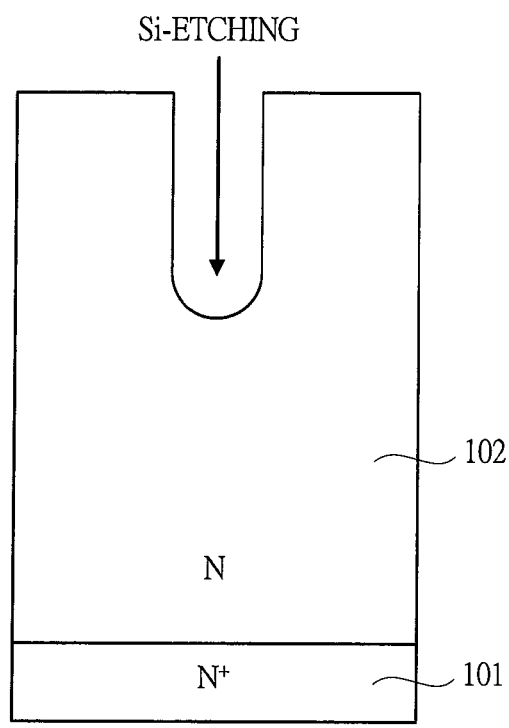
FIG. 2A is a view showing an example of the manufacturing method of the vertical trench MOSFET with low breakdown voltage having the RESURF structure according to the first embodiment of the present invention.

First, as shown in FIG. 2A, to the N type epitaxial region 102 grown on the $N^+$ type substrate 101, silicon-etching for forming the gate trench is performed. More particularly, the N type epitaxial region 102 is formed on the upper surface of the $N^+$ type substrate 101, and then, the gate trench extending from the front surface into the N type epitaxial region 102 is formed by silicon-etching. The depth of the gate trench is approximately 0.4 μm to 1.2 μm.

Figure 2B:
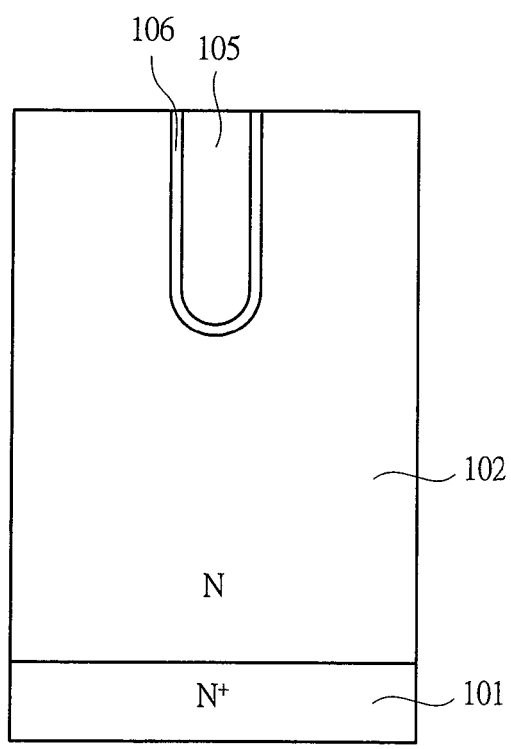
FIG. 2B is a view showing an example of the manufacturing method (continued from FIG. 2A) of the vertical trench MOSFET with low breakdown voltage having the RESURF structure according to the first embodiment of the present invention.

Next, as shown in FIG. 2B, the gate electrode 105 is formed through the gate insulator 106. More particularly, the gate insulator 106 is formed in the gate trench, and then, the gate electrode 105 is formed in the gate trench so as to interpose the gate insulator 106. For example, poly-silicon is used for the gate electrode 105. The thickness of the gate insulator 106 is approximately 40 nm to 80 nm so as to ensure the gate-source breakdown voltage.

Figure 2C:
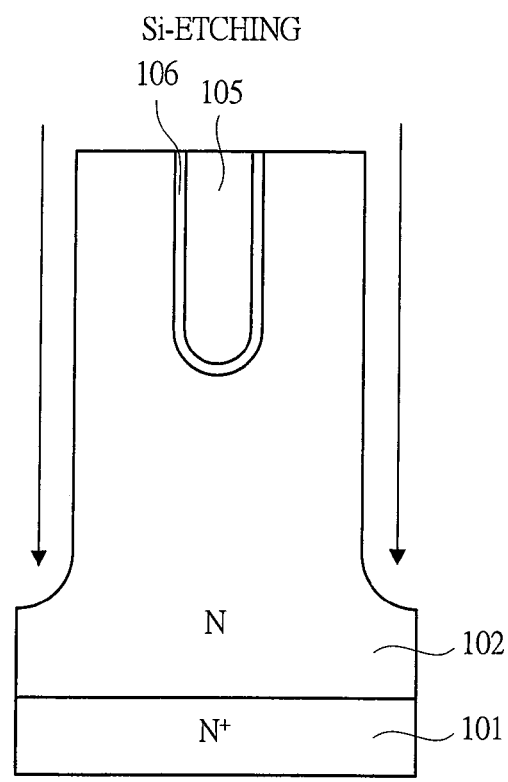
FIG. 2C is a view showing an example of the manufacturing method (continued from FIG. 2B) of the vertical trench MOSFET with low breakdown voltage having the RESURF structure according to the first embodiment of the present invention.

Next, as shown in FIG. 2C, silicon-etching for forming the source trench is performed. More particularly, the source trench extending from the front surface into the N type epitaxial region 102 is formed by silicon-etching. Generally, the thickness of the epitaxial region in the power MOSFET with drain-source breakdown voltage of approximately 30 V is approximately 2 μm to 4 μm, and the depth of the source trench is desirable to be approximately 1 μm to 4 μm in order to fully utilize the RESURF effect.

Figure 2D:
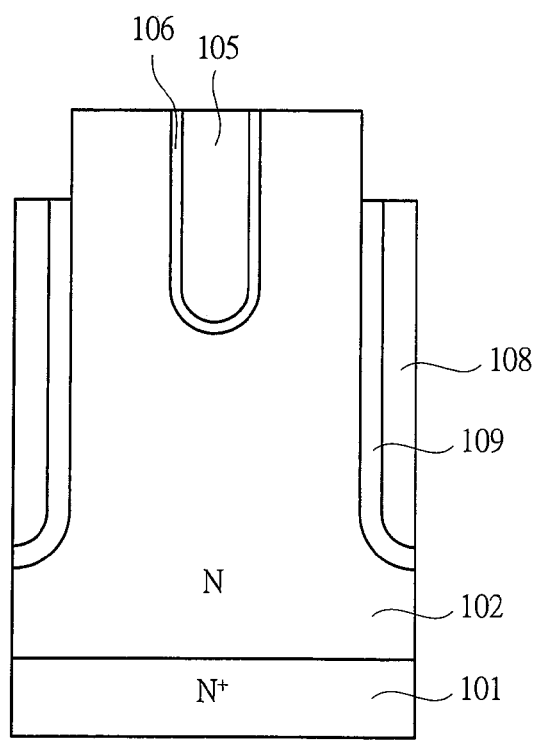
FIG. 2D is a view showing an example of the manufacturing method (continued from FIG. 2C) of the vertical trench MOSFET with low breakdown voltage having the RESURF structure according to the first embodiment of the present invention.

Next, as shown in FIG. 2D, the trench-buried source electrode 108 is formed through the trench-buried source insulator 109. More particularly, the trench-buried source insulator 109 is formed in the source trench, and then, the trench-buried source electrode 108 is formed in the source trench so as to interpose the trench-buried source insulator 109. For example, poly-silicon is used for the trench-buried source electrode 108. The thickness of the trench-buried source insulator 109 is desirable to be approximately 50 nm to 150 nm so as to prevent the breakdown voltage of the trench-buried source insulator 109 from being lower than the drain-source breakdown voltage of silicon.

Figure 2E:
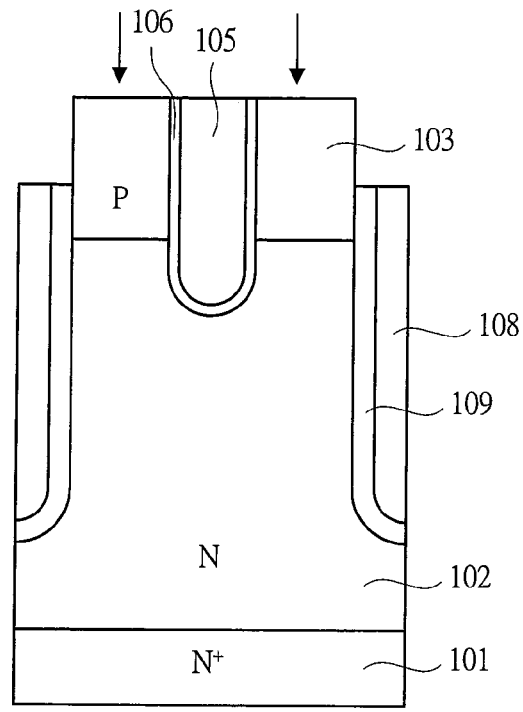
FIG. 2E is a view showing an example of the manufacturing method (continued from FIG. 2D) of the vertical trench MOSFET with low breakdown voltage having the RESURF structure according to the first embodiment of the present invention.
Figure 2F:
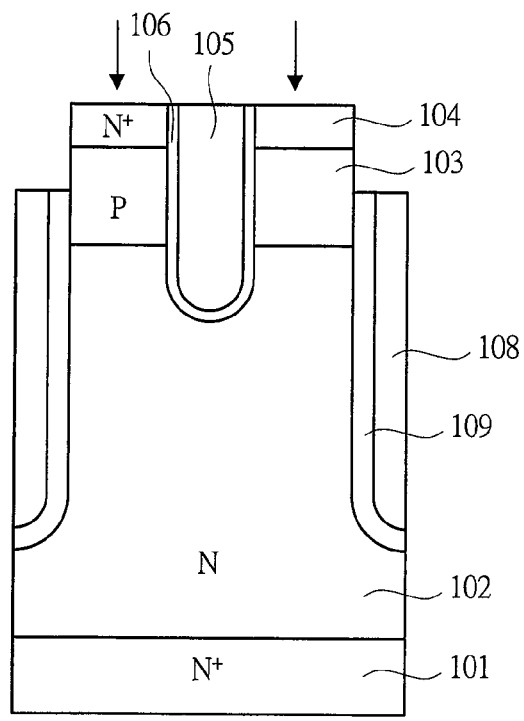
FIG. 2F is a view showing an example of the manufacturing method (continued from FIG. 2E) of the vertical trench MOSFET with low breakdown voltage having the RESURF structure according to the first embodiment of the present invention.

Next, as shown in FIG. 2E, the channel region 103 is formed by ion implantation of P type impurity. More particularly, the channel region 103 is formed on the N type epitaxial region 102 adjacent to the gate trench. Thereafter, as shown in FIG. 2F, the source region 104 is formed by ion implantation of N type impurity. More specifically, the source region 104 is formed on the channel region 103 adjacent to the gate trench.

Figure 2G:
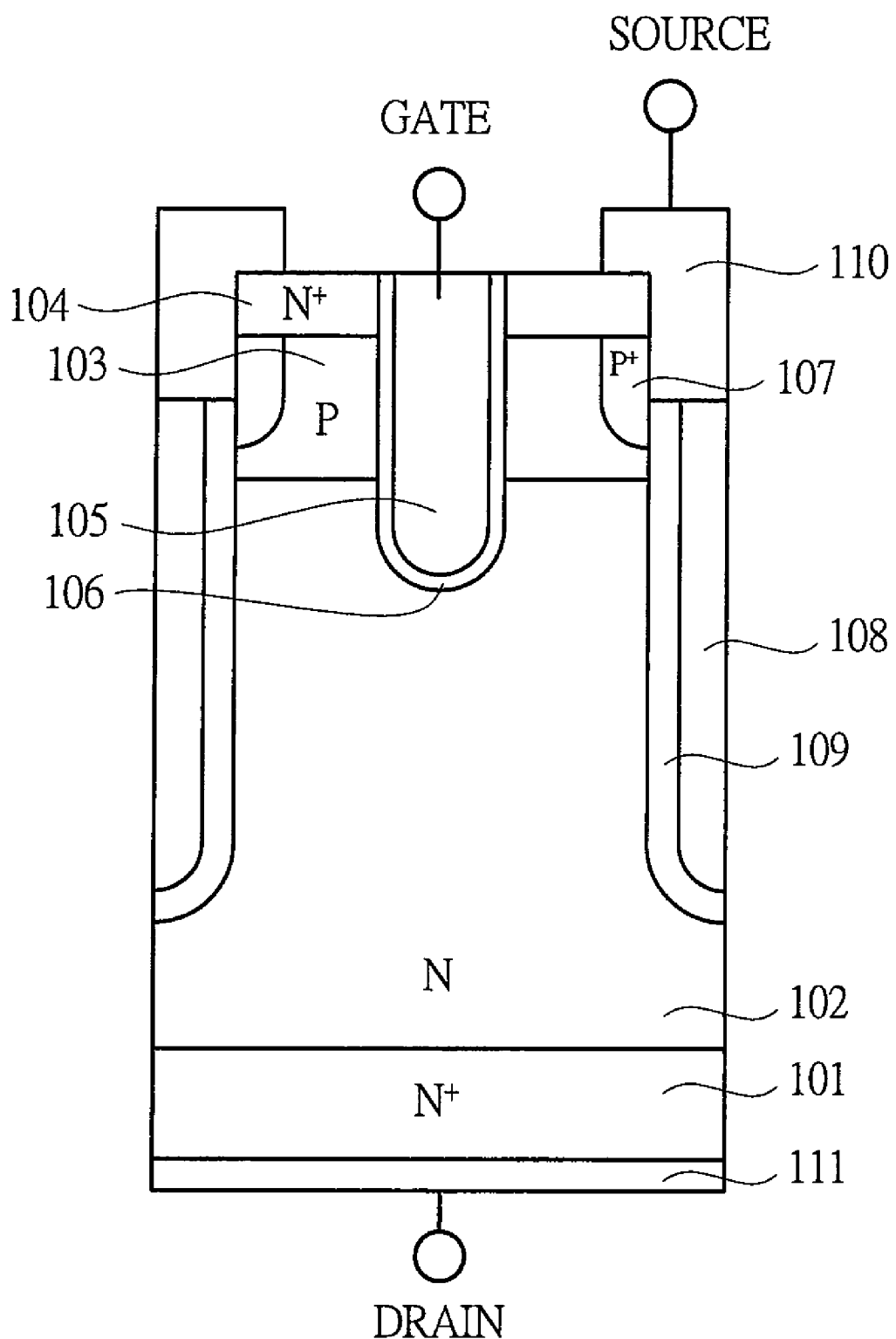
FIG. 2G is a view showing an example of the manufacturing method (continued from FIG. 2F) of the vertical trench MOSFET with low breakdown voltage having the RESURF structure according to the first embodiment of the present invention.

Next, as shown in FIG. 2G, the body contact region 107 is formed on the upper portion of the source trench by ion implantation of P type impurity. Then, the device structure according to the first embodiment is completed through the metal process of forming the source electrode 110 contacting with the upper portion of the source region 104 and the trench-buried source electrode 108 and forming the drain electrode 111 on the rear surface of the $N^+$ type substrate 101.

Figure 3:
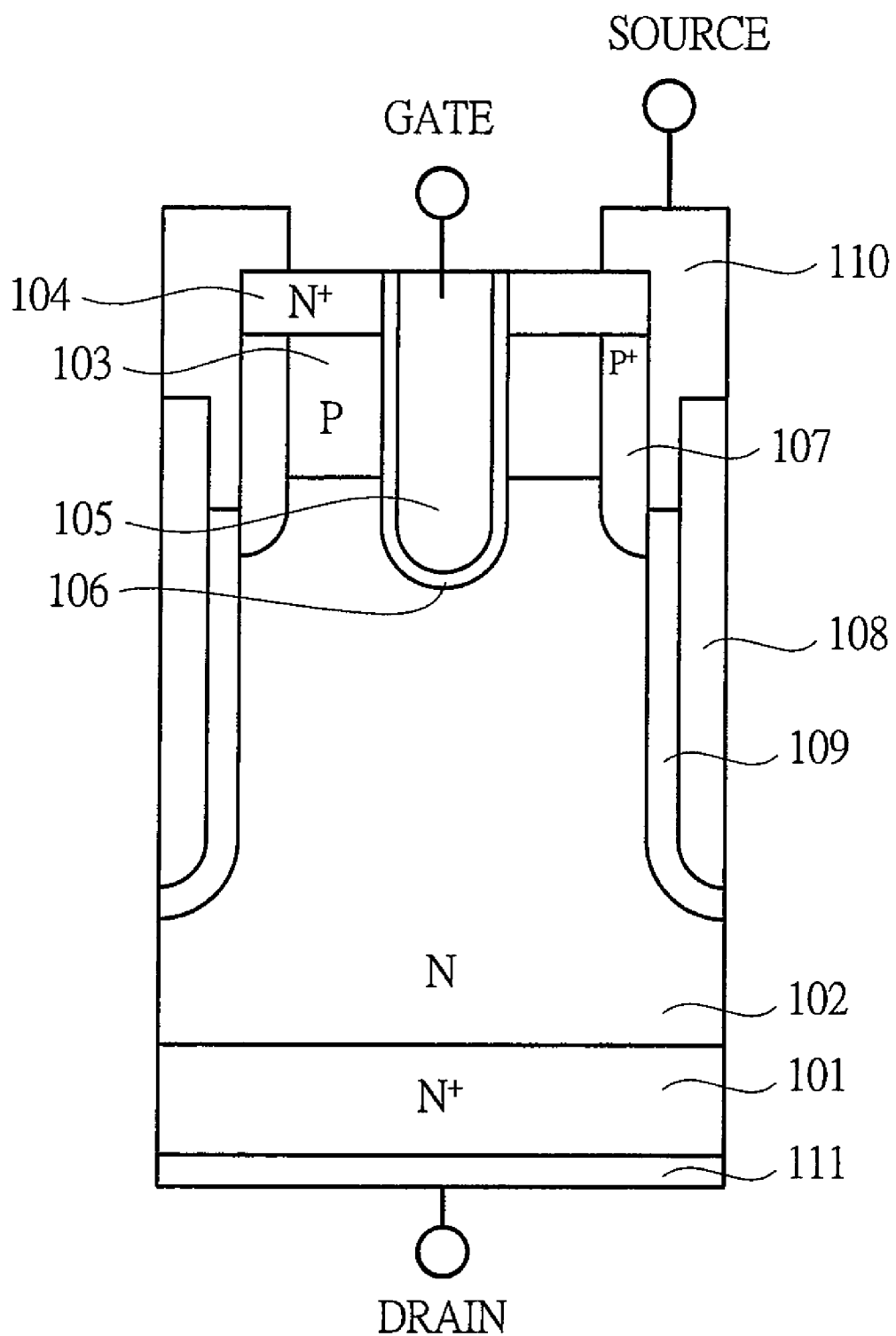
FIG. 3 is a view showing another example of the structure of the vertical trench MOSFET with low breakdown voltage having the RESURF structure according to the first embodiment of the present invention.

Note that, in the process following FIG. 2D, it is concerned that the upper surface of the trench-buried source insulator 109 is positioned lower than the lower surface of the channel region 103. However, even in the case, since the body contact region 107 is formed down to the portion lower than the upper surface of the trench-buried source insulator 109 by ion implantation as shown in FIG. 3, the N type epitaxial region 102 is not in contact with the source electrode 110.

Further, since the source trench is formed by silicon-etching as shown in FIG. 2C, diffusion in a horizontal direction like that in the ion implantation does not occur, and this manner is appropriate to a fine structure. Therefore, this manner can be applied to a fine power MOSFET with low breakdown voltage.

Figure 4:
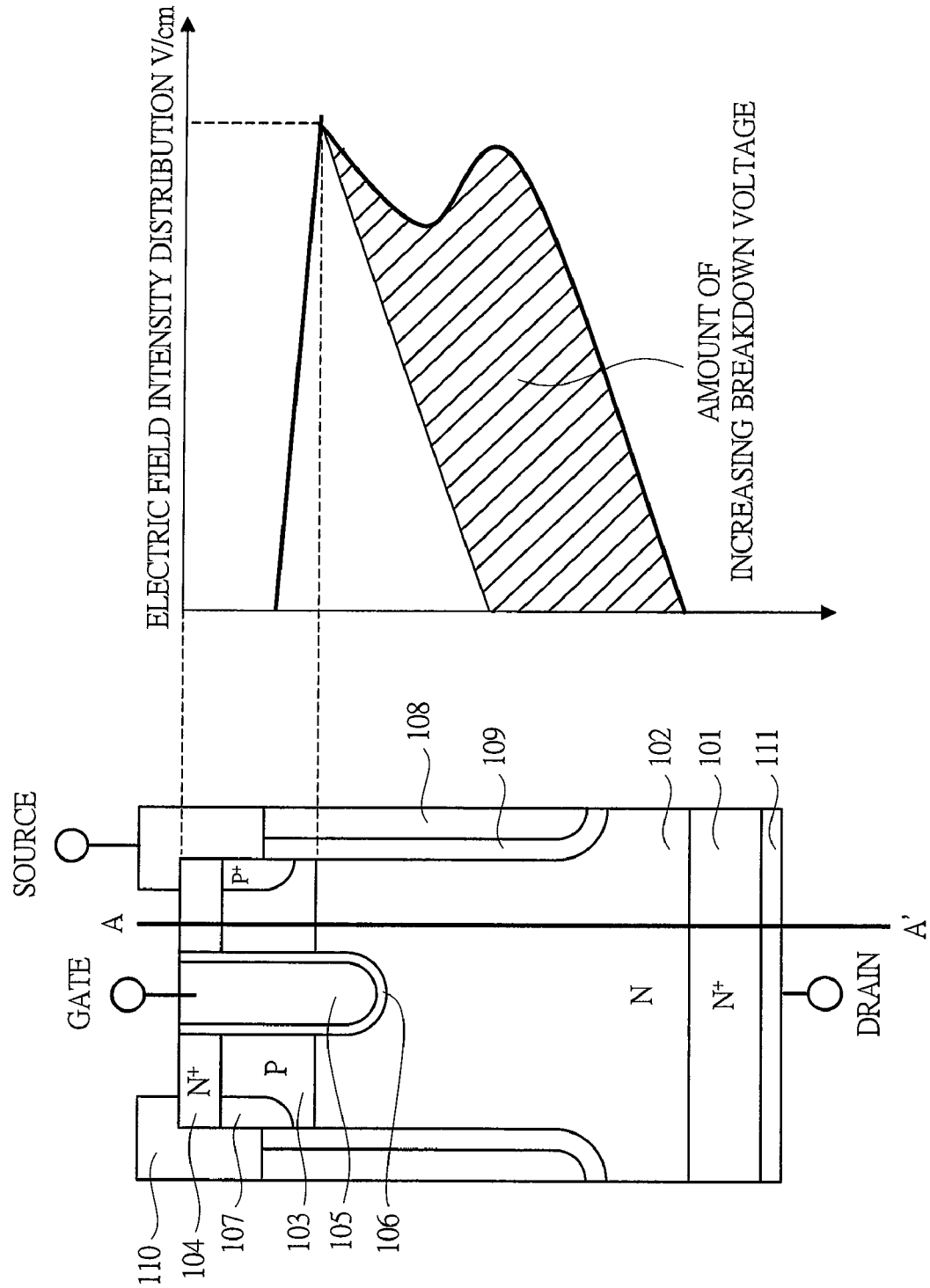
FIG. 4 is a schematic diagram of electric field intensity distribution according to the first embodiment of the present invention.
Figure 5:
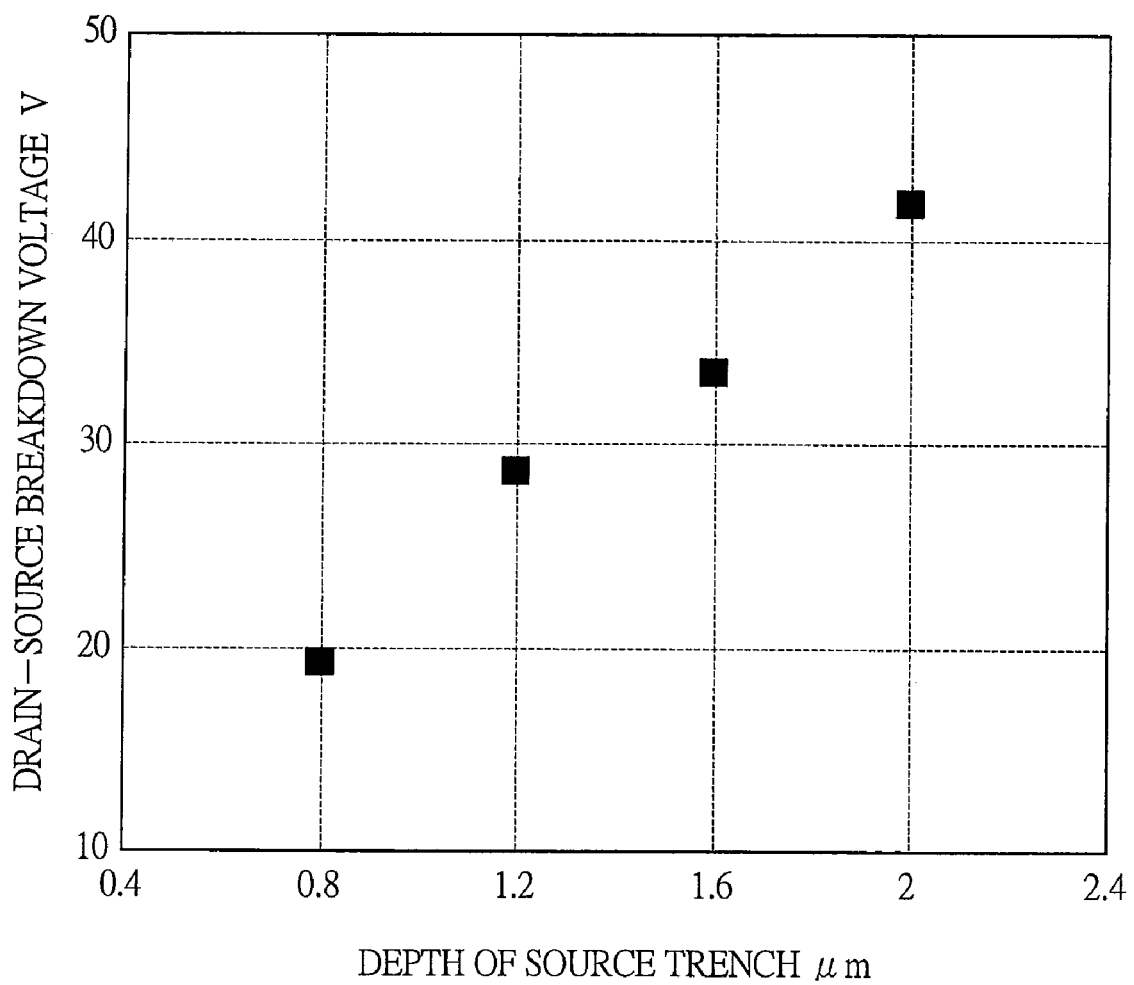
FIG. 5 is a view showing a simulation result of the relationship between the depth of the source trench and the drain-source breakdown voltage according to the first embodiment of the present invention.

FIG. 4 shows a schematic diagram of electric field intensity distribution in the line A-A' in the vertical trench MOSFET according to the first embodiment. As shown in FIG. 4, the trench-buried source electrode 108 forms the potential distribution in a horizontal direction, and the breakdown voltage equivalent to the amount shown by the shaded area is increased. A simulation result of the relationship between the drain-source breakdown voltage and the depth of the source trench is shown in FIG. 5. The drain-source breakdown voltage is increased as the depth of the source trench is increased, and the drain-source breakdown voltage is 41.7 V when the depth of the source trench is 2 µm.

As another manufacturing method according to the first embodiment, the process of forming the source trench can be performed in advance of the process of forming the gate trench, and the formation of the insulator or the electrode in the gate trench and the source trench can be performed at the same time. Furthermore, for the purpose of reducing the gate resistance, the use of a laminate structure of poly-silicon and silicide for the gate electrode can be considered.

According to the present embodiment, by the device structure and its manufacturing method described above, the potential distribution in a horizontal direction is formed between the trench-buried source electrodes 108, so that the electric field at PN junction between the N type epitaxial region 102 and the channel region 103 is relaxed, whereby the drain-source breakdown voltage can be increased. Further, there is no need to provide another region for the body contact on the front surface of the semiconductor device, and therefore, the further scaling down can be achieved. As a result, the reduction in on-resistance can be achieved while maintaining the drain-source breakdown voltage even in the vertical trench MOSFET with low breakdown voltage.

Second Embodiment

A semiconductor device according to a second embodiment of the present invention is described with reference to FIG. 6 and FIG. 7.

Figure 6:
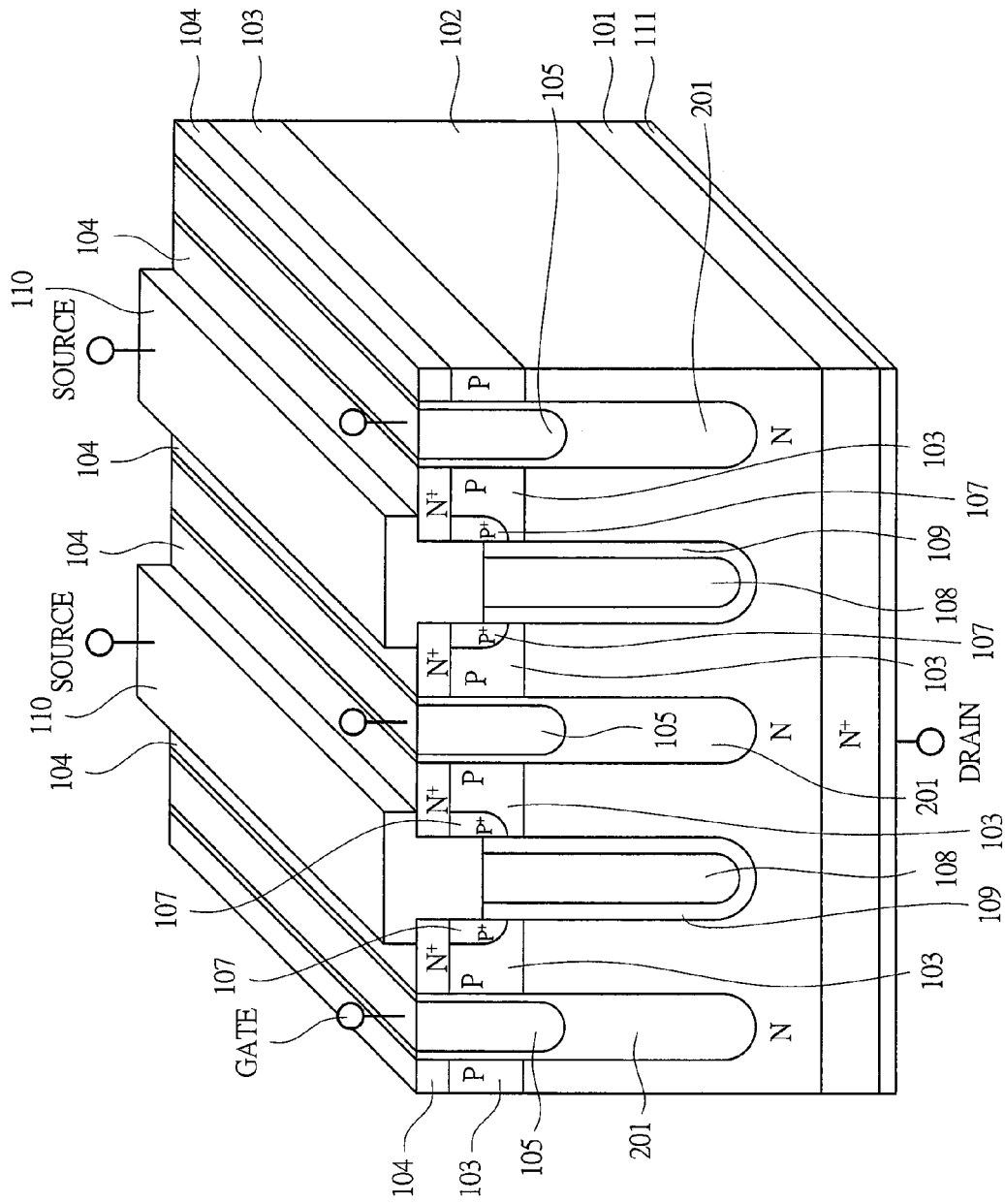
FIG. 6 is a view showing an example of the structure of the vertical trench MOSFET with low breakdown voltage having the RESURF structure according to the second embodiment of the present invention.

FIG. 6 shows an example of a structure of the vertical trench MOSFET with low breakdown voltage having the RESURF structure according to the second embodiment of the present invention.

The vertical trench MOSFET according to the second embodiment is different from the first embodiment in the following points. The present embodiment is characterized in that the distance from the front surface to the bottom of the gate trench is equal to the distance from the front surface to the bottom of the field trench, the gate insulator of the bottom surface in the gate trench is thicker than that of the side surface in the gate trench, and the process of forming the gate trench and the process of forming the field trench are performed at the same time. Also, the present embodiment is characterized in that a thickness of a gate insulator 201 of the bottom surface in the gate trench is larger than a distance from an interface between the N type epitaxial region 102 and the channel region 103 to the gate insulator 201 of the bottom surface in the gate trench.

More specifically, in the vertical trench MOSFET according to the present embodiment, the depth of the gate trench is equal to that of the source trench, and the bottom part of the gate insulator 201 is increased in thickness. Since the depth of the gate trench is equal to that of the source trench, silicon-etching can be performed to the gate trench and to the source trench at the same time. Furthermore, since the bottom part of the gate insulator 201 is increased in thickness, a feedback capacitance can be reduced.

FIG. 7 shows an example of a manufacturing method of the vertical trench MOSFET with low breakdown voltage having the RESURF structure according to the second embodiment.

Figure 7A:
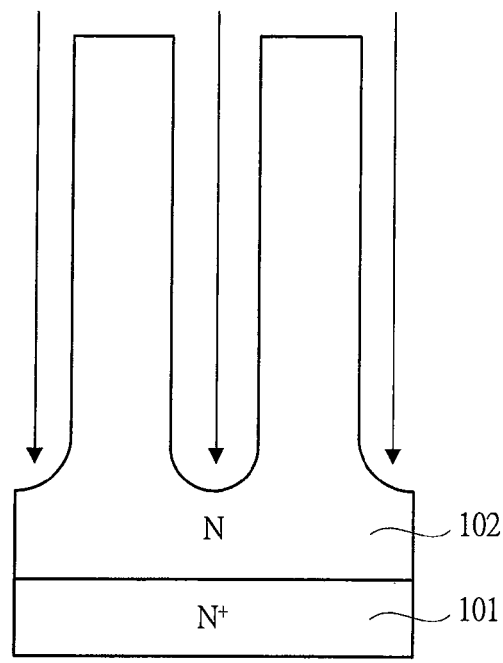
FIG. 7A is a view showing an example of the manufacturing method of the vertical trench MOSFET with low breakdown voltage having the RESURF structure according to the second embodiment of the present invention.

First, as shown in FIG. 7A, to the N type epitaxial region 102 grown on the N+ type substrate 101, silicon-etching for forming the gate trench and the source trench is performed. Since the depth of the gate trench is equal to that of the source trench, silicon-etching can be performed to the gate trench and the source trench at the same time.

Figure 7B:
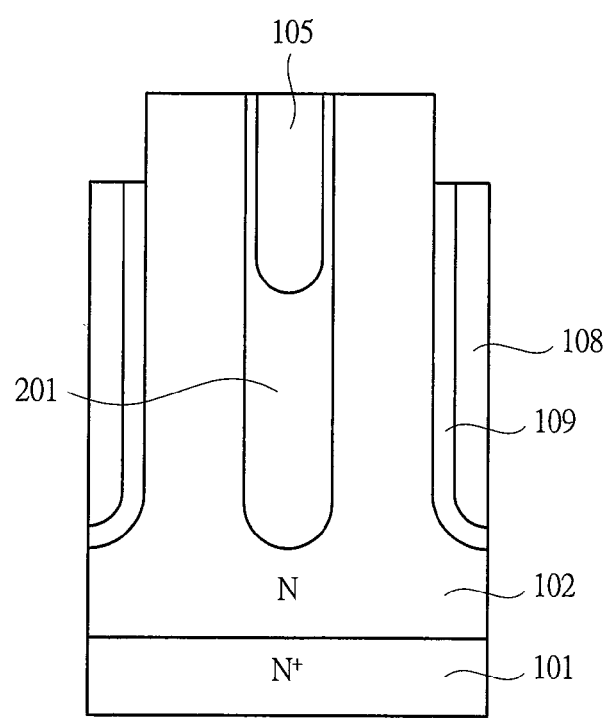
FIG. 7B is a view showing an example of the manufacturing method (continued from FIG. 7A) of the vertical trench MOSFET with low breakdown voltage having the RESURF structure according to the second embodiment of the present invention.

Next, as shown in FIG. 7B, the gate insulator 201, the trench-buried source insulator 109, the gate electrode 105, and the trench-buried source electrode 108 are formed. For the reduction of the feedback capacitance, the bottom part of the gate insulator 201 is increased in thickness.

Figure 7C:
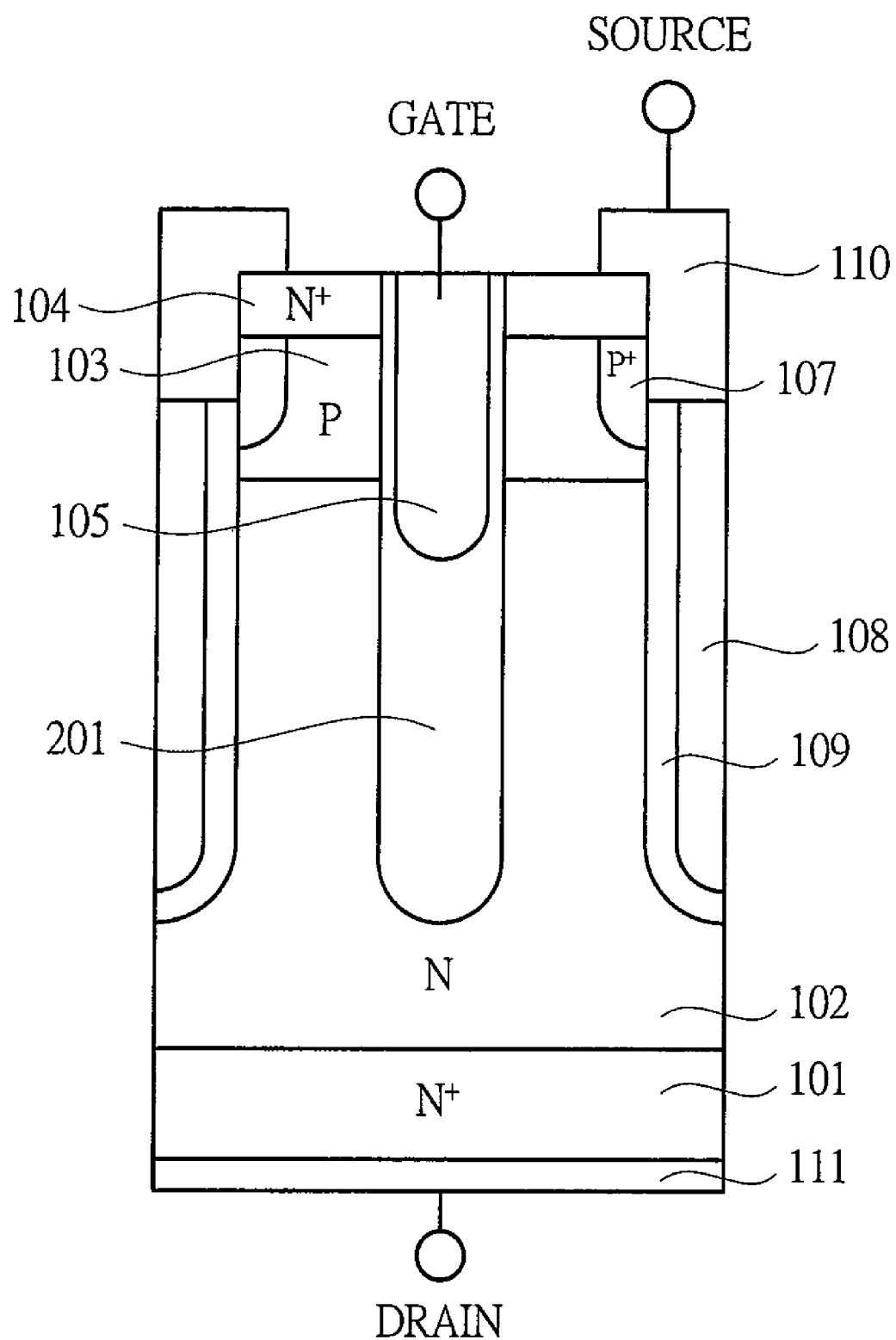
FIG. 7C is a view showing an example of the manufacturing method (continued from FIG. 7B) of the vertical trench MOSFET with low breakdown voltage having the RESURF structure according to the second embodiment of the present invention.

Next, as shown in FIG. 7C, the channel region 103, the source region 104, and the body contact region 107 are formed, and the device structure according to the second embodiment is completed through the metal process.

According to the present embodiment, by the device structure and its manufacturing method described above, in addition to the effect of the first embodiment, silicon-etching can be performed to the gate trench and the source trench at the same time, and the feedback capacitance can be reduced.

Third Embodiment

A semiconductor device according to a third embodiment of the present invention is described with reference to FIG. 8.

Figure 8:
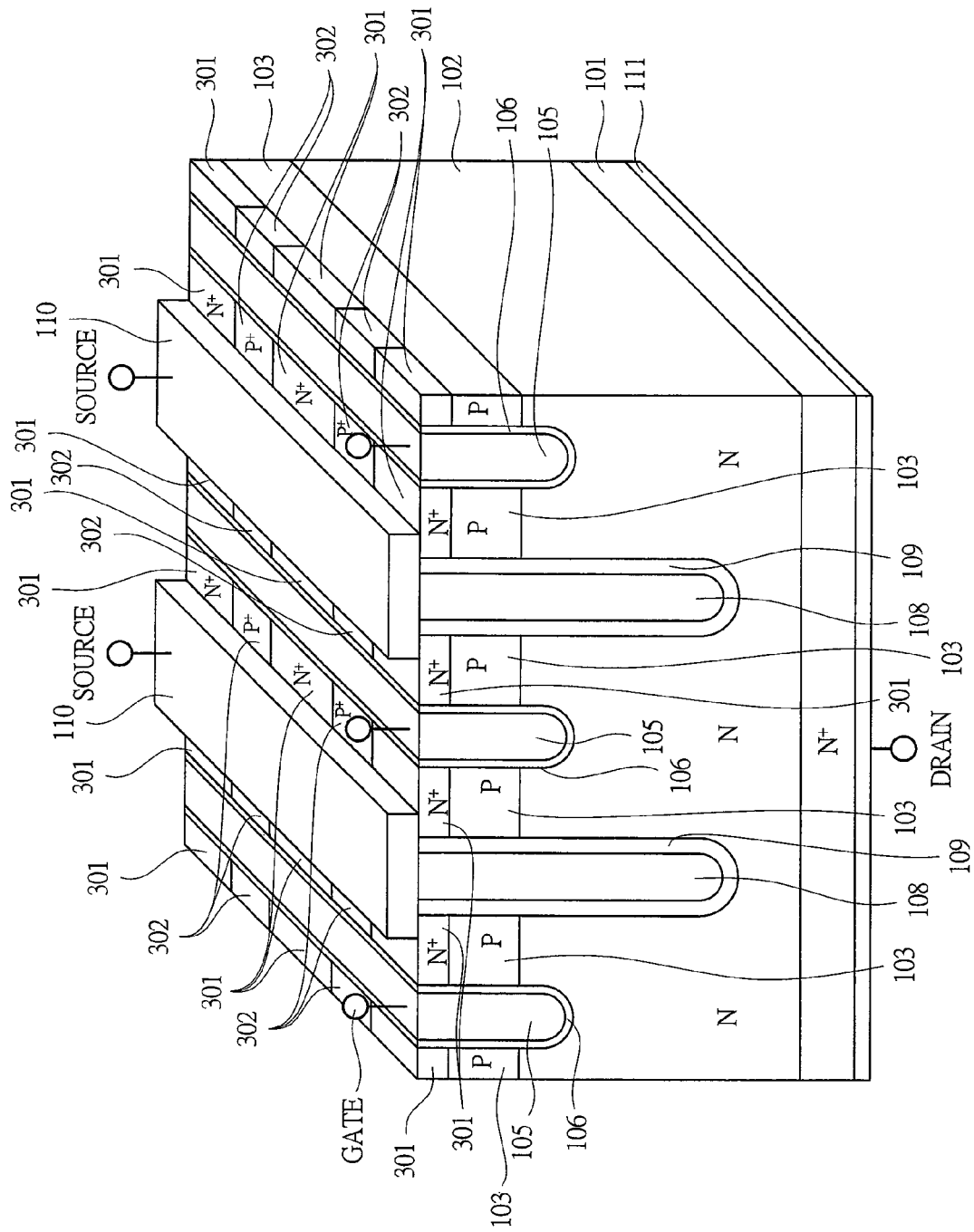
FIG. 8 is a view showing an example of the structure of the vertical trench MOSFET with low breakdown voltage having the RESURF structure according to the third embodiment of the present invention.

FIG. 8 shows an example of a structure of the vertical trench MOSFET with low breakdown voltage having the RESURF structure according to the third embodiment of the present invention.

The vertical trench MOSFET according to the third embodiment is different from the first embodiment in the following point. The present embodiment is characterized in that a more highly-doped body contact region 302 than the channel region 103 is selectively formed on the front surface of the channel region 103.

More specifically, in the vertical trench MOSFET according to the present embodiment, on the front surface of the channel region 103, the body contact region 302 is formed so as to be alternately disposed with the source region 301 in a backward direction. In this manner, in addition to the effect of the first embodiment, the sufficient avalanche resistance can be obtained.

Fourth Embodiment

A semiconductor device according to a fourth embodiment of the present invention is described with reference to FIG. 9.

Figure 9:
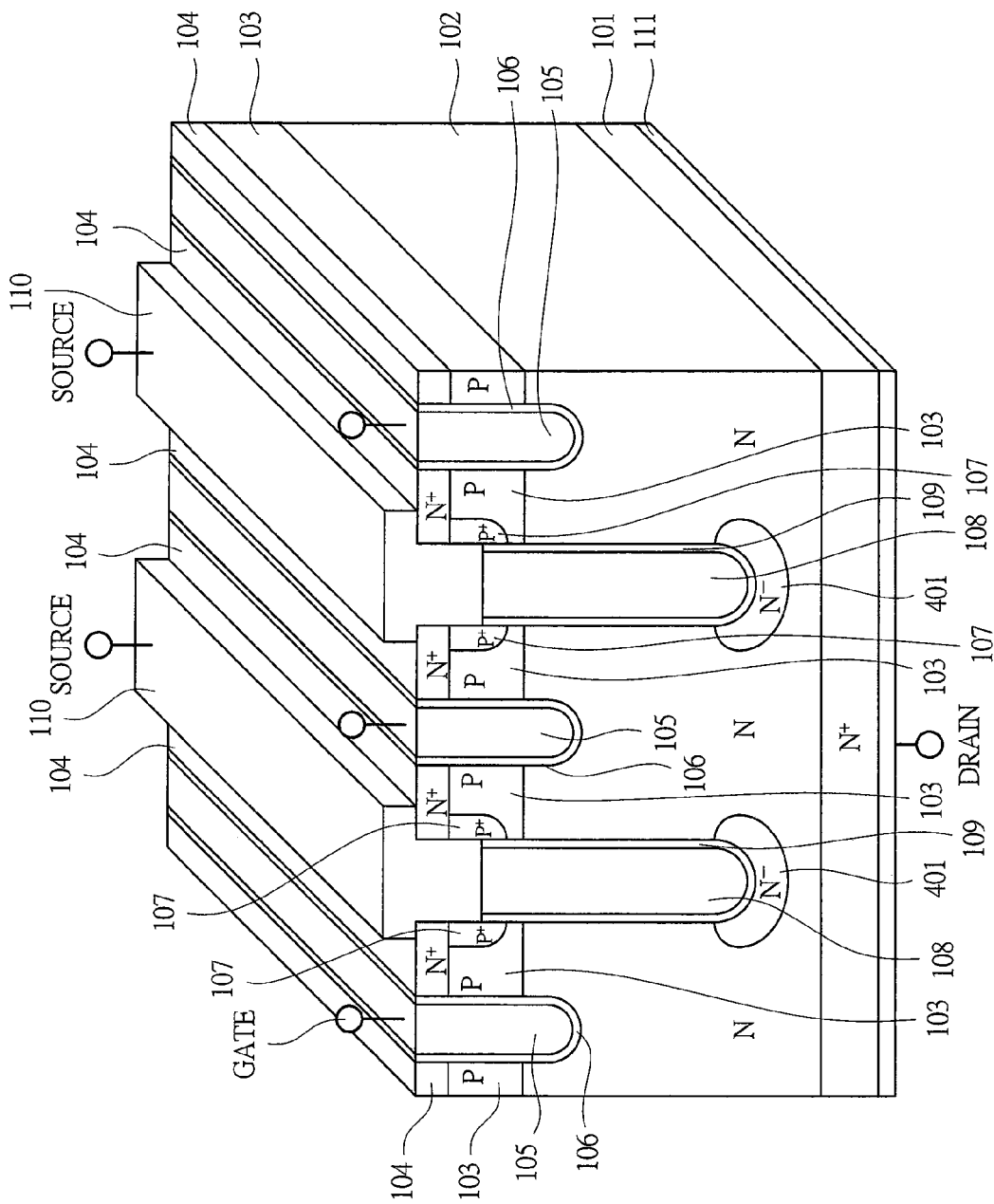
FIG. 9 is a view showing an example of the structure of the vertical trench MOSFET with low breakdown voltage having the RESURF structure according to the fourth embodiment of the present invention.

FIG. 9 shows an example of a structure of the vertical trench MOSFET structure with low breakdown voltage having the RESURF structure according to the fourth embodiment of the present invention.

The vertical trench MOSFET according to the fourth embodiment is different from the first embodiment in the following point. The present embodiment is characterized in that a less doped N⁻ type region 401 than the N type epitaxial region 102 is provided in the N type epitaxial region 102 under the field trench.

More specifically, in the vertical trench MOSFET according to the present embodiment, the N⁻ type region 401 is formed immediately under the source trench. With the N⁻ type region 401, the electric field applied to the trench-buried source insulator 109 is relaxed. In this manner, in addition to the effect of the first embodiment, the trench-buried source insulator 109 can be thinned, so that the gate insulator 106 and the trench-buried source insulator 109 can be formed in the same process.

Fifth Embodiment

A semiconductor device according to a fifth embodiment of the present invention is described with reference to FIG. 10.

FIG. 10 shows an example of a structure of the vertical trench MOSFET with low breakdown voltage having the RESURF structure according to the fifth embodiment of the present invention.

The vertical trench MOSFET according to the fifth embodiment is different from the first embodiment in the following point. The present embodiment is characterized in that the bottom of the field trench reaches the inside of the N⁺ type substrate 101.

More specifically, in the vertical trench MOSFET according to the present embodiment, the source trench extends into the N⁺ type substrate 101. In this manner, in addition to the effect of the first embodiment, a variation of the drain-source breakdown voltage due to the difference of the depth of the source trench can be prevented.

Sixth Embodiment

A semiconductor device according to a sixth embodiment of the present invention is described with reference to FIG. 11.

FIG. 11 shows an example of a structure of the vertical planar MOSFET with low breakdown voltage having the RESURF structure according to the sixth embodiment of the present invention.

The vertical planar MOSFET according to the sixth embodiment is different from the first embodiment in the following point. The present embodiment is characterized by comprising the N type epitaxial region 102 formed on the upper surface of the N⁺ type substrate 101 having the drain electrode 111 on the lower surface thereof, a channel region (P type) 501 selectively formed on the front surface of the N type epitaxial region 102, a source region (N⁺ type) 502 selectively formed on the front surface of the channel region 501, a gate electrode 503 positioned on the channel region 501 so as to interpose a gate insulator 504, the source electrode 110 formed on the source region 502, the source trench extending from the front surface into the N type epitaxial region 10, and the trench-buried source electrode 108 positioned in the source trench so as to interpose the trench-buried source insulator 109, and the source electrode 110 contacts in the source trench with the body contact region 107 which contacts with the channel region 501.

More specifically, in the vertical planar MOSFET according to the present embodiment, the gate insulator 504 is formed on the front surface of the channel region 501, and the gate electrode 503 is further formed on the gate insulator 504. In this manner, in addition to the effect of the first embodiment, the omission of a process of forming the gate trench can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments above, the N channel type power MOSFET has been described. However, the P channel type power MOSFET or IGBT may be applied, and the present invention can be widely applied to the other semiconductor devices.

The present invention relates to a power MOSFET and can be effectively applied to a power MOSFET device structure with low breakdown voltage and a manufacturing method thereof. Furthermore, it is applicable to semiconductor devices having a vertical structure in general.

What is claimed is:

1. A semiconductor device comprising:
   a first semiconductor region of a first conductivity type formed on an upper surface of a semiconductor substrate having a rear surface electrode on a lower surface thereof;
   a gate trench extending from a front surface of the semiconductor device into the first semiconductor region;
   a gate electrode positioned in the gate trench so as to interpose an insulator;
   a second semiconductor region of a second conductivity type formed on the first semiconductor region and adjacent to the gate trench;
   a third semiconductor region of the first conductivity type formed on the second semiconductor region and adjacent to the gate trench;
   a field electrode formed on the third semiconductor region;
   a field trench extending from the front surface of the semiconductor device into the first semiconductor region;
   a trench-buried field electrode positioned in the field trench so as to interpose an insulator; and
   a fourth semiconductor region that is less doped than the first semiconductor region and of the first conductivity type, where the fourth semiconductor region is disposed in the first semiconductor region under the field trench,
   wherein the field electrode contacts with the trench-buried field electrode.

2. The semiconductor device according to claim 1, wherein a distance from the front surface of the semiconductor device to a bottom of the field trench is longer than that from the front surface of the semiconductor device to a bottom of the gate trench.

3. The semiconductor device according to claim 1, wherein the field electrode contacts with the second semiconductor region in the field trench or contacts with a more highly-doped body contact region that the second semiconductor region, the body contact region being of second conductivity type and contacting with the second semiconductor region.

4. The semiconductor device according to claim 1, wherein a distance from the front surface of the semiconductor device to a bottom of the gate trench is equal to that from the front surface of the semiconductor device to a bottom of the field trench.

5. The semiconductor device according to claim 4,
wherein an insulator of a bottom surface in the gate trench is thicker than an insulator of a side surface in the gate trench.

6. The semiconductor device according to claim 5,
wherein a thickness of the insulator of the bottom surface in the gate trench is larger than a distance from an interface between the first semiconductor region and the second semiconductor region to the insulator of the bottom surface in the gate trench.

7. The semiconductor device according to claim 1,
wherein a more highly-doped body contact region than the second semiconductor region, the body contact region being of second conductivity type, is selectively formed on a front surface of the second semiconductor region.

8. The semiconductor device according to claim 1,
wherein a bottom of the field trench reaches an inside of the semiconductor substrate.

9. The semiconductor device according to claim 1,
wherein the gate trench and the field trench are in parallel relationship to each other.

10. The semiconductor device according to claim 9,
wherein the gate trench and the field trench are alternately positioned to each other.

11. The semiconductor device according to claim 1,
wherein the trench-buried field electrode is poly-silicon.

12. A semiconductor device comprising:
a first semiconductor region of a first conductivity type formed on an upper surface of a semiconductor substrate having a rear surface electrode on a lower surface thereof;
a second semiconductor region of a second conductivity type selectively formed on a front surface of the first semiconductor region;
a third semiconductor region of the first conductivity type selectively formed on a front surface of the second semiconductor region;
a gate electrode positioned on the second semiconductor region so as to interpose an insulator;
a field electrode formed on the third semiconductor region;
a field trench extending from a front surface of a semiconductor device into the first semiconductor region;
a trench-buried field electrode positioned in the field trench so as to interpose an insulator; and
a fourth semiconductor region that is less doped than the first semiconductor region and of the first conductivity type, where the fourth semiconductor region is disposed in the first semiconductor region under the field trench,
wherein the field electrode contacts with the trench-buried field electrode.

13. The semiconductor device according to claim 12,
wherein the field electrode contacts with the second semiconductor region in the field trench or contacts with a more highly-doped body contact region than the second semiconductor region, the body contact region being of second conductivity type and contacting with the second semiconductor region.

14. The semiconductor device according to claim 12,
wherein a more highly-doped body contact region than the second semiconductor region, the body contact region being of second conductivity type, is selectively formed on the front surface of the second semiconductor region.

15. The semiconductor device according to claim 12,
wherein a bottom of the field trench reaches an inside of the semiconductor substrate.

16. The semiconductor device according to claim 12,
wherein the trench-buried field electrode is poly-silicon.

* * * * *